United States Patent [19]

Seko et al.

[11] Patent Number: 5,002,977

[45] Date of Patent: Mar. 26, 1991

[54] ACTIVE ENERGY RAY-CURABLE UNSATURATED RESIN COMPOSITION

[75] Inventors: Kenji Seko; Naozumi Iwasawa, both of Hiratsuka, Japan

[73] Assignee: Kansai Paint Co., Ltd., Hyogo, Japan

[21] Appl. No.: 353,335

[22] Filed: May 17, 1989

[30] Foreign Application Priority Data

May 17, 1988 [JP] Japan .................. 63-119899
May 17, 1988 [JP] Japan .................. 63-119900

[51] Int. Cl.$^5$ .................. C08F 269/00; C08F 273/00
[52] U.S. Cl. .................. 522/149; 525/286
[58] Field of Search .................. 522/149

[56] References Cited

FOREIGN PATENT DOCUMENTS 0091091  8/1977  Japan .
1514804  6/1978  United Kingdom .
2191495 12/1987  United Kingdom .

*Primary Examiner*—Marion E. McCamish
*Assistant Examiner*—Susan Berman
*Attorney, Agent, or Firm*—Wenderoth, Lind & Ponack

[57] ABSTRACT

An unsaturated resin composition curable with an active energy ray, comprising a reaction product between an acid group-containing vinylic resin and an alicyclic epoxy group-containing unsaturated compound; and an unsaturated resin composition curable with an active energy ray, comprising a reaction product between an alicyclic epoxy group-containing vinylic resin and an acid group-containing unsaturated compound.

12 Claims, No Drawings

ACTIVE ENERGY RAY-CURABLE UNSATURATED RESIN COMPOSITION

This invention relates to an unsaturated resin composition curable by irradiation of an active energy ray.

Various types of active energy ray-curable unsaturated resin compositions have been developed and, come into widespread use in the fields of coating, composite materials and electrical component parts. Attempts have recently been made to develop resin compositions composed mainly of vinyl resins as one type of such active energy ray-curable unsaturated resin compositions. Compositions obtained by reacting vinyl resins having a high acid value and aliphatic epoxy group-containing vinyl compounds are now known as the compositions composed mainly of vinyl resins. These vinyl resin compositions, however, do not have entirely satisfactory properties. They have inferior storage stability during long-term storage at high temperatures, and films formed from these compositions have low water resistance and inferior adhesion to adherends.

The present inventors made extensive investigations in order to solve the problems of the prior art, and have found that the use of a reaction product between an acid group-containing vinylic resin and an alicyclic epoxy group-containing unsaturated compound as a major component of an active energy ray-curable unsaturated resin composition can lead to a solution of the aforesaid problems.

Thus, the present invention provides an active energy ray-curable unsaturated resin composition comprising a reaction product between an acid group-containing vinylic resin and an alicyclic epoxy group-containing unsaturated compound.

The resin composition of the invention will be described below in detail.

ACID GROUP-CONTAINING VINYLIC RESIN

The acid group-containing vinylic resin used in the resin composition of this invention includes vinylic resins containing an acid group such as a carboxyl group as a pendant side chain. The resins may be known acid group-containing vinylic resins which can be produced, for example, by copolymerizing an ethylenically unsaturated acid with at least one other vinylic monomer.

Examples of the ethylenically unsaturated acid that can be used in this reaction are (meth)acrylic acid and crotonic acid; carboxyalkyl (meth)acrylates such as 2-carboxyethyl (meth)acrylate or 2-carboxypropyl (meth)acrylate; and maleic acid, maleic anhydride and itaconic acid. Of these, (meth)acrylic acid, 2-carboxyethyl (meth)acrylate and 2-carboxypropyl (meth)acrylate are preferred.

Examples of the other vinylic monomer that can be copolymerized with the ethylenically unsaturated acid include the following compounds.

(a) (Meth)acrylic acid esters $C_1$-$C_{24}$ alkyl esters of (meth)acrylic acid such as methyl (meth)acrylate, ethyl (meth)acrylate, propyl (meth)acrylate, butyl (meth)acrylate, 2-ethylhexyl (meth)acrylate and stearyl (meth)acrylate; $C_2$-$C_{39}$ hydroxyalkyl esters of (meth)acrylic acid such as 2-hydroxyethyl (meth)acrylate, 2-hydroxypropyl (meth)acrylate, 2-hydrobybutyl (meth)acrylate, 4-hydroxybutyl (meth)acrylate, butanediol mono(meth)acrylate, polyethylene glycol mono(meth)acrylate and polypropylene glycol mono(meth)acrylate.

(b) Vinyl aromatic compounds

Styrene, alpha-methylstyrene, vinyltoluene and p-chlorostyrene.

(c) Amide-type vinyl compounds (Meth)acrylamide diacetone acrylamide N-methylolacrylamide and N-butoxymethylacrylamide.

(d) Polyolefinic compounds

Butadiene, isoprene and chloroprene.

(e) Other vinylic monomers (Meth)acrylonitrile, methyl isopropenyl ketone, vinyl acetate, Veova monomer (a product of Shell Chemical Co.), vinyl propionate and vinyl pivalate.

At least one of these vinylic monomers is selected according to the properties required of the acid group-containing vinylic resin obtained after copolymerization.

The copolymerization of the ethylenically unsaturated acid with at least one vinyl monomer may be carried out in accordance with a known radical polymerization method by, for example, polymerizing a mixture of the ethylenically unsaturated acid and the vinyl monomer in the presence of a radical polymerization initiator in an organic solvent.

The radical polymerization initiator that can be used may be, for example, an azo compound, a peroxide compound, a sulfide, a sulfone, or a redox system, which are usually employed in radical polymerization.

Examples of the organic solvent that can be used in this polymerization include alcohol solvents such as ethanol, propanol and butanol, Cellosolve-type solvents such as ethyl Cellosolve and butyl Cellosolve, propylene glycol-type solvents such as propylene glycol monomethyl ether, carbitol-type solvents such as diethylene glycol monomethyl ether, glyme-type solvents such as ethylene glycol dimethyl ether, aromatic hydrocarbontype solvents such as toluene and xylene, ester-type solvents such as butyl acetate, methyl Cellosolve acetate, ethyl Cellosolve acetate and butyl Cellosolve acetate, and ketone-type solvents such as methyl ethyl ketone, methyl isobutyl ketone and cyclohexanone.

An unsaturated group is introduced into the resulting acid group-containing vinylic resin by utilizing the reaction between the acid group of the resin with the epoxy groups in the alicyclic epoxy group-containing unsaturated compound. In order to permit introduction of unsaturated groups necessary for curing with active energy rays, the acid goup-containing vinylic resin should have an acid value of generally at least 15, preferably 20 to 600, more preferably 30 to 550. Accordingly, in the above copolymerization, the ethylenically unsaturated acid is used in such a proportion that the resulting resin has an acid value within the above range.

Particularly when it is desired to water-disperse or water solubilize the reaction product between the acid group-containing vinylic resin and the epoxy group-containing unsaturated compound, the acid group-containing vinylic resin should leave acid groups required for water-dispersing or water-solubilization of the reaction product in addition to the need to introduce unsaturated groups. It is desirable for the acid group-containing vinylic resin to have an acid value of generally at least 20, preferably 30 to 700, more preferably 40 to 600.

The acid group-containing vinylic resin may have a number average molecular weight of usually 1,000 to 100,000, especially 3,000 to 70,000.

ALICYCLIC EPOXY GROUP-CONTAINING UNSATURATED COMPOUND

The alicyclic epoxy group-containing unsaturated compound used in this invention includes compounds having one radical-polymerizable unsaturated group such as an ethylenically unsaturated group and one alicyclic epoxy group per molecule. Examples of such unsaturated compounds are compounds represented by the following formulae.

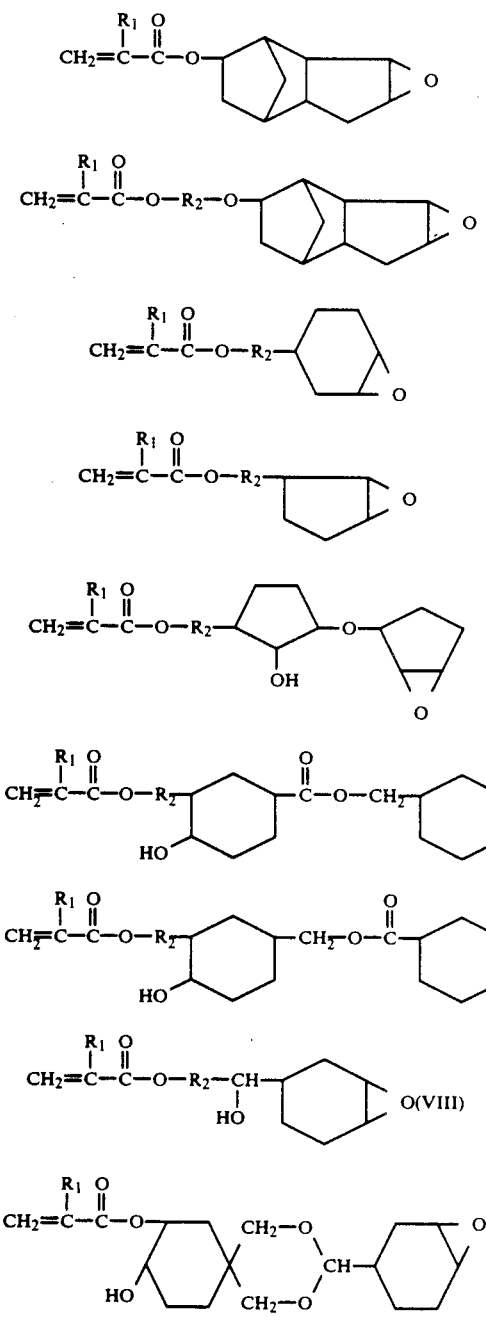

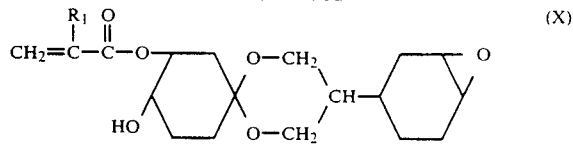

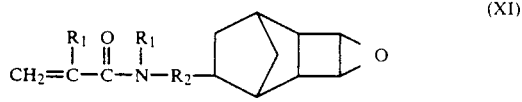

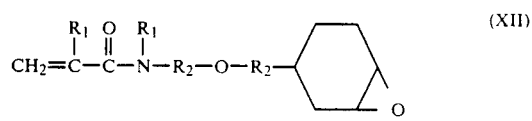

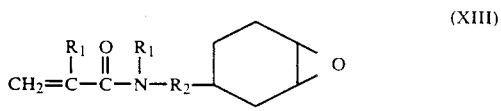

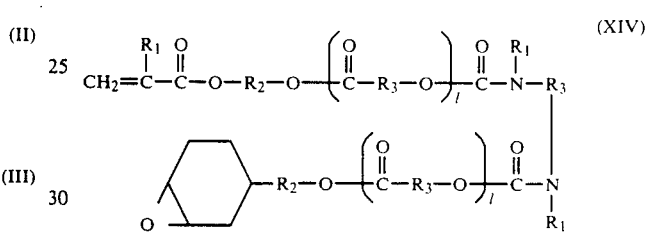

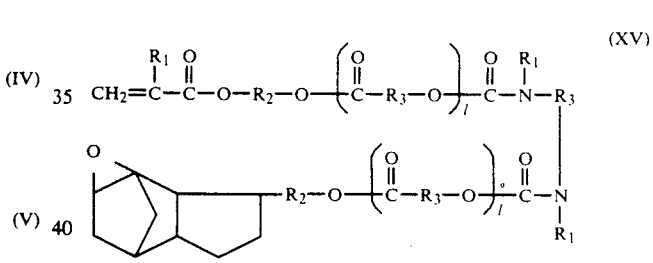

In the above formulae, $R_1$ represents a hydrogen atom or a methyl group; $R_2$ represents a divalent aliphatic saturated hydrocarbon group having 1 to 6 carbon atoms; $R_3$ represents a divalent hydrocarbon group having 1 to 10 carbon atoms; and $l$ is an integer of 0 to 10, particularly 0 to 6.

Examples of the divalent aliphatic saturated hydrocarbon groups represented by $R_2$ in the above formulae include methylene, ethylene, propylene, tetramethylene, ethylethylene, pentamethylene and hexamethylene groups. Examples of the divalent hydrocarbon group having 1 to 10 carbon atoms represented by $R_3$ are linear or branched $C_1-C_{10}$ alkylene groups such as methylene, ethylene, propylene, tetramethylene, ethylethylene, pentamethylene, hexamethylene and polymethylene; $C_3-C_{10}$ cycloalkylene groups such as a cyclohexylene group; a phenylene group;

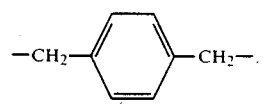

Compounds of formulae (I), (II), (III), (IV), (VIII), (XII) and (XIII) are especially preferred among the above alicyclic epoxy group-containing unsaturated compounds.

The above alicyclic epoxy group-containing unsaturated compound may be used in combination with an aliphatic epoxy group-containing unsaturated compound such as glycidyl (meth)acrylate, glycidyl beta-methyl (meth)acrylate and allyl glycidyl ether in an amount of up to 90 % by weight, preferably up to 60 % by weight, based on the total weight of the alicyclic epoxy group-containing unsaturated compound and the aliphatic epoxy group-containing compound.

PREPARATION OF AN ACTIVE ENERGY RAY-CURABLE UNSATURATED RESIN COMPOSITION

By reacting the acid group-containing vinylic resin with the alicyclic epoxy group-containing unsaturated compound, a resin having a radical polymerizable unsaturated group introduced thereinto (to be referred to as the unsaturated group-containing resin) is prepared.

Such an unsaturated group-containing resin can be produced, for example, by adding the alicyclic epoxy group-containing unsaturated compound to a solution of the acid group-containing vinylic resin in an inert organic solvent, and reacting them at a temperature of usually about 20 to about 120° C., preferably about 50 to about 115° C. for a period of about 1 to about 12 hours. Examples of the inert organic solvent used to prepare the solution of the acid group-containing vinylic resin include alcohols such as ethanol, propanol, butanol and 2-ethylhexyl alcohol, esters such as ethyl acetate, butyl acetate, methyl Cellosolve acetate, ethyl Cellosolve acetate and butyl Cellosolve acetate, Cellosolve solvents such as ethyl Cellosolve and butyl Cellosolve, propylene glycols such as propylene glycol monomethyl ether, carbitols such as diethylene glycol, glymes such as propylene glycol dimethyl ether, aromatic hydrocarbons such as toluene and xylene and ketones such as methyl ethyl ketone, methyl isobutyl ketone and cyclohexanone. When the acid group-containing vinylic resin is produced by solution polymerization, the resulting resin solution may be used as such or after being diluted with the aforesaid solvent. When the unsaturated group-containing resin obtained by reaction with the alicyclic epoxy group-containing unsaturated compound is to be water-dispersed or water-solubilized, hydrophilic organic solvents such as alcohols and Cellosolves are preferred as the aforesaid solvent.

The resulting unsaturated group-containing resin in solution form may be directly used in the active energy ray-curable unsaturated resin composition. Alternatively, it may be used after it is water-dispersed or water-solubilized by methods to be described hereinafter.

Since the unsaturated group-containing resin is a main component which is to be cured by irradiation of an active energy ray, the resin should contain unsaturated groups sufficient for curing. The unsaturated group-containing resin desirably contains generally 0.2 to 4.0, preferably 0.7 to 3.5, more preferably 1.5 to 3.5, per 1000 of number average molecular weight, radical polymerizable unsaturated groups in a pendant side chain. If the number of unsaturated groups is too small, the curability of the resin becomes insufficient, and the resulting coated film has poor water resistance and poor adhesion to an adherend. Furthermore, when such a composition is used in a printed circuit board, it has poor etching resistance to acidic etching solutions, such as a cupric chloride solution, and the resulting printed circuit board tends to have a poor resolution. If, on the other hand, the number of unsaturated groups is too large, thickening and gellation are liable to occur during the preparation of the unsaturated group-containing resin, and furthermore, the composition of the invention might undergo thickening or gellation during long-term storage.

The unsaturated group-containing resin may have a number average molecular weight of generally 1 000 to 100,000, preferably 3,000 to 70,000, more preferably 5,000 to 30,000.

The unsaturated group-containing resin may contain acid groups which remain unreacted after the reaction of the acid group-containing vinylic resin with the alicyclic epoxy group-containing unsaturated compound. If the number of the remaining acid groups is too large, a coated film prepared from the resin composition of this invention has degraded water resistance. Hence, the acid value of the unsaturated group-containing resin is advantageously not more than 300, preferably not more than 200. When the unsaturated group-containing resin is to be used after water-dispersion or water-solubilization, the unsaturated group-containing resin desirably contains acid groups sufficient for neutralizing the resin with a base to effect water-dispersion or water-solubilization, and its amount, as an acid value, is usually 20 to 300, preferably 25 to 200, more preferably 30 to 150.

Water-dispersing and water-solubilizing of the unsaturated 9group-containing resin containing the acid groups in such proportions can be effected by neutralizing it with bases. Examples of the bases that can be used are alkanolamines such as monoetnanolamine, diethanolamine and triethanolamine; alkylamines such as triethylamine, diethylamine, monometnylamine, diisopropylamine, trimethylamine and diisobutylamine; alkylalkanolamines such as dimethylalinoethanol; alicyclic amines such as cyclohexylamine; alicyclic amines such as cyclohexylamine; alkali metal hydroxides such as sodium hydroxide and potassium hydroxide; and ammonia. They may be used singly or in combination. The amount of the base used is not strictly limited. Usually, it is 0.3 to 1.0 equivalent, preferably 0.4 to 0.7 equivalent, per mole of the acid groups in the resin. In order to increase the flowability of the resin component at the time of water-dispersion or water-solubilization, a hydrophilic solvent may be added to the resin. Examples of the hydrophilic solvent are isopropanol, n-butanol, t-butanol, methoxyethanol, ethoxyethanol, butoxyethanol, diethylene glycol monomethyl ether, methyl ether, dioxane and tetrahydrofuran. The suitable amount of the hydrophilic solvent is generally not more than 300 parts by weight, preferably not more than 150 parts by weight, per 100 parts by weight of the resin component.

A hydrophobic solvent may, as required, be added to the water-dispersed or water-solubilized unsaturated group-containing resin in order to improve its coatability on a substrate. Examples of the hydrophobic solvent are petroleum-type solvents such as toluene and xylene, ketones such as methyl ethyl ketone and methyl isobutyl ketone, an ester such as ethyl acetate and butyl acetate, and alcohols such as 2-ethylhexyl alcohol. The amount of the hydrophobic solvent is usually not more than 200 parts by weight, preferably not more than 150 parts by weight, per 100 parts of the resin component.

In the resin composition of this invention, the unsaturated group-containing resin may also be used as a solution in an organic solvent. If the unsaturated group-containing resin prepared as above is in the form of an organic solvent solution, it can be directly used or may be used after it is diluted with a miscible organic solvent.

The unsaturated group-containing resin may also be used as a solution in a polymerizable vinyl monomer to be described hereinafter.

The concentration of the unsaturated group-containing resin in the composition of this invention is not critical, and may be varied over a wide range depending upon the type or state of the resin. Its suitable solids concentration is generally 1 to 99 % by weight, preferably 5 to 90 % by weight.

According to another embodiment of this invention, the unsaturated group-containing resin may be a reaction product of an alicyclic epoxy group-containing vinylic resin with an acid group-containing unsaturated compound.

The alicyclic epoxy group-containing vinylic resin includes copolymers obtained by copolymerizing at least one of alicyclic epoxy group-containing unsaturated monomers of formulae (I) to (XV) as an essential monomer component with the same monomer as mentioned with regard to the production of the acid group-containing vinylic resin, for example at least one monomer selected from (meth)acrylic acid esters, vinyl aromatic compounds, amide-type vinyl compounds, polyolefinic compounds and other monomers by the same method as described hereinabove.

The copolymer may have a number average molecular weight of generally 1,000 to 100,000, especially 3,000 to 70,000, and desirably has an epoxy equivalent of usually 250 to 5,000, preferably 300 to 1,500.

The acid group-containing unsaturated compound that can be reacted with the alicyclic epoxy group-containing vinylic resin is a compound which contains one radical polymerizable unsaturated group such as an ethyl-enically unsaturated group per molecule and an acid group such as a carboxyl group. Specific examples include (meth)acrylic acid, 2-carboxyethyl (meth)acrylate, 2-carboxypropyl (meth)acrylate, maleic acid and maleic anhydride.

In this embodiment, the unsaturated group-containing containing resin may be produced, for example, by reacting a solution of the alicyclic epoxy group-containing vinylic resin in an inert organic solvent and the acid group-containing unsaturated compound at a temperature of about 20 to 120° C. for a period of about 1 to 7 hours.

The resulting unsaturated group-containing resin contains 0.2 to 4.0, preferably 0.7 to 3.5, more preferably 1.5 to 3.5, unsaturated groups per 1,000 of number average molecular weight, and may have a number average molecular weight of 1,000 to 100,000, preferably 3,000 to 70,000.

The resulting unsaturated group-containing resin may be used in the resin composition of this invention as a solution in an organic solvent or a solution in a polymerizable vinyl monomer. A known polymerizable vinyl monomer and/or a polymerizable prepolymer may be incorporated in the active energy ray-curable unsaturated resin composition of this invention according to its uses and the required film properties.

The polymerizable vinyl monomer may be, for example, a compound containing at least 1, usually 1 to 6, polymerizable vinyl groups per molecule. Specific examples are given below.

(i) Monovalent vinyl monomers (Meth)acrylic acid esters, vinyl aromatic compounds, amide-type vinyl compounds, polyolefinic compounds and other monomers described above with regard to the production of the acid group-containing vinylic resin; adducts between hydroxyl-containing monomers [such as 2-hydroxyethyl (meth)acrylate and 2-hydroxypropyl (meth)acrylate] and monoisocyanates (such as butyl isocyanate and phenyl isocyanate); and aziridine group-containing monomers such as

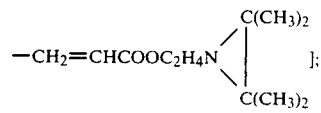

and phosphorus-containing vinyl monomers [such as an adduct between 2-hydroxyethyl (meth)acrylate and phosphoric acid].

(ii) Polyvalent vinyl monomers

Reaction products between polyhydric alcohols and (meth)acrylates (such as butanediol diacrylate, trimethylolpropane triacrylate and pentaerythritol tetra-acrylate); reaction products between polyalkylene glycol and (meth)acrylates (such as diethylene glycol di-acrylate, propylene glycol diacrylate, polyethylene glycol diacrylate and polypropylene glycol diacrylate); reaction products between caprolactone-modified polyhydric alcohols and (meth)acrylates; and phosphorus-containing divinyl monomers.

On the other hand, the polymerizable prepolymer may be a compound having at least one polymerizable vinyl group, usually 2 to 300 such groups, per molecule and a number average molecular weight of 400 to 50,000. Specific examples include polymerizable unsaturated group-containing resins capable of being rendered aqueous, such as a resin obtained by introducing a hydroxyalkyl (meth)acrylate into a carboxyl group-containing polyol via a polyisocyanate compound; and polymerizable unsaturated group-containing resins, such as polyester polyol (meth)acrylate, polyetherpolyol (meth)acrylate, acrylic polyol (meth)acrylate, an adduct of a polyepoxy compound and (meth)acrylic acid, and a resin obtained by introducing a hydro-yalkyl (meth)acrylate into a polyol via a polyisocyanate compound.

The amount of the polymerizable vinyl monomer and/or the polymerizable prepolymer to be incorporated is not critical, and may be varied over a wide range depending upon the types of the polymerizable monomer and prepolymer, and the type of the unsaturated group-containing resin. Generally, the convenient amount is not more than 100 parts by weight, preferably not more than 50 parts by weight, per 100 parts by weight of the unsaturated group-containing resin (solids content).

As required, the composition of this invention may further contain a coloring agent such as a pigment or dye in an amount which does not substantially impair the curability of the composition with an active energy ray.

Furthermore, the composition of this invention may contain, as required, an epoxy resin such as a phenol novolak epoxy resin, a bisphenol-epicnlorohydrin-type epoxy resin, a glycol ether-type epoxy resin and a polycarboxylic acid ester-type epoxy resin in an amount of up to 100 parts by weight, preferably up to 70 parts by weight, per 100 parts by weight of the unsaturated group-containing resin (solids) in order to further improve the curability of a film prepared from the composition.

The composition of this invention described hereinabove has excellent curability by active energy ray irradiation because of the inclusion of the specific unsaturated group-containing resin, and moreover the chemical linkage formed as a result or the reaction of the acid groups with the alicyclic epoxy groups in the unsaturated group-containing resin has a relatively large steric hindrance. Hence, the resin composition is stable to hydrolysis and shows excellent storage stability in long-term storage without separation and sedimentation of resin components when it is used in the form of a water dispersion or a water solution. Furthermore, the film formed from the composition shows excellent resistance to chemicals such as alkalies, acids and water and excellent adhesion to coating substrates because of the above chemical linkage. In particular, when the composition is applied as an etching resist film for a printed circuit board, the printed circuit board obtained has an excellent resolution.

The composition of this invention is thus useful as a paint, a printing ink, a photoresist, a solder resist, a plate-making material, an adhesive, a tackifier, etc.

The method of forming a film from the resin composition differs depending upon whether the composition is of water-base or organic solvent-base. Generally, the composition is coated on a substrate, such as wood, paper, an inorganic material, plastics and metals (zinc, iron, copper, aluminum), buy a coating machine such as a natural roll coater, a reverse roll coater, a gravure roll coater, a screen printing machine, a curtain coater, an air sprayer, an airless sprayer, a bar coater, a knife coater, a spin coater, a brush, an electrodeposition coater or a dip coated. Where appropriate, water, the solvent, etc. are removed by drying. Then, an active energy ray such as an electron beam or ultraviolet ray is irradiated on the coated film to cure it. The dry film thickness is generally not more than 2,000 micrometers, preferably 1 to 1,000 micrometers, more preferably 2 to 500 micrometers.

Various types of electron beam accelerators may be used to accelerate electron beams which release an active energy ray to be used for irradiation in this invention. They include Cockcroft-Walton, Van de Graaf, resonance transformer, transformer, insulated core transformer, dynamitron, liner filament, broad beam, area beam, cathode electrode and high frequency types. The dose of the electron beams is not particularly limited so long as it is sufficient for curing the coated film. Generally, it is about 100 to 2,000 KeV, preferably 150 to 1,000 KeV, and about 0.5 to 20 Megarads, preferably 1 to 10 Megarads. Preferably, electron beams are irradiated usually in an inert gas.

Sources of radiation for irradiating ultraviolet rays as an active energy ray include, for example, a mercury lamp, a high pressure mercury lamp, a xenone lamp, a carbon arc, a metal halide lamp and solar light. Ultraviolet irradiation may be carried out in air or in an inert gas. When air is used as an irradiating atmosphere, it is especially preferred to use a high-pressure mercury lamp as the irradiation source. The irradiation conditions vary according to the amount and type of the photopolymerization initiator used. Generally, the irradiation is carried out for a period of less than several minutes, usually 1 second to 20 minutes, using light having wavelength in the range of 3,000 to 4,500 Å.

When the resin composition or this invention is to be cured by ultraviolet irradiation, a photopolymerization initiator is usually incorporateded in the composition. Typical examples of the photopolymerization initiator that can be added include benzoin, benzoin methyl ether, benzoin ethyl ether, benzoin n-propyl ether, benzoin n-butyl ether, benzophenone, p-methyl-benzophenone, Michler's ketone, acetophenone, 2-chlorothioxanthon anthraquinone, chloroanthraquinone, 2-methylanthraquinone, phenyldisulfide, 2-nitrofluorene, butyroin, anisoisoethyl ether, azobisisobutyronitrile and tetramethylthiuram disulfide.

These photopolymerization initiators may be used singly or in combination with each other. The amount of the photopolymerization initiator to be added is not strictly limited. Conveniently, it is used in an amount of usually 0.05 to 15 % by weight, preferably 0.1 to 10 % by weight, based on the weight of the composition of this invention.

To accelerate the photopolymerization reaction by the above photopolymerization initiator, a photopolymerization accelerator may also be used in combination. Typical examples of the photopolymerization accelerator include tertiary amines such as triethymamine, triethanolamine and 2-dimethylaminoethanol; phosphines typified by triphenylphosphine; and thiols typified by beta-thioglycol. Generally, the photopolymerization accelerator may be used in a proportion of 5 to 200 parts by weight, preferably 20 to 100 parts by weight, per 100 parts by weight of the photopolymerization initiator.

The composition of this invention, for example one containing the water-dispersed or water-solubilized unsaturated group-containing resin, may be applied to the production of a printed circuit board, and an example of it will be described below at some length.

An anodic electrodeposition bath is prepared by adjusting the pH of a water dispersion or solution of the composition of this invention to 5 to 10 and its solids content to 3 to 30 % by weight, preferably 5 to 15 % by weight. The bath is kept at a temperature of 15 to 40° C., preferably 15 to 30° C. A printed circuit base board (which may have through-holes), obtained by cladding an insulator with a copper foil and the subjecting the clad material to copper-plating, is immersed in the electrodeposition bath as an anode. A direct current is applied at 20 to 400 V between the anode and the cathode in the bath. The suitable current passing time is 30 seconds to 5 minutes, and the thickness of the coating on drying is desirably 2 to 100 micrometers, preferably 3 to 20 micrometers.

After the electrodeposition, the coated base board is pulled up from the bath and washed with water, and then water on the surface of the electrodeposited film is removed by hot air or otherwise.

A pattern mask (photographic negative) is put on the resulting photosensitive electrodeposited film an actinic light ray such as an ultraviolet ray is irradiated on a conductor circuit (circuit pattern).

The unexposed portion of the film is removed by a developing treatment with an aqueous alkaline solution or the like. The developing treatment is carried out by spraying weak alkaline water onto the film surface and thus washing away the unexposed portion of the film. The weak alkaline water may usually be an aqueous solution having a pH of 8 to 10, such as an aqueous solution of sodium hydroxide, sodium carbonate, potassium hydroxide or ammonia which can neutralize the tree carboxylic acid in the coated film and render it water-soluble.

The copper foil portion (the non-circuit portion) exposed on the base board as a result of the developing treatment is removed by a usual etching treatment using a solution of ferric chloride, for example. Thereafter, the exposed film on the circuit pattern is also remved by dissolving with a chlorine-containing solvent such as trichloroethylene or an alkali having a pH of at least 12 such as sodium hydroxide or potassium hydroxide to form a printed circuit on the base board.

The following Examples illustrate the present invention specifically. All parts and percentages in the following examples are by weight unless otherwise specified.

SYNTHESIS EXAMPLE 1 (UNSATURATED RESIN)

A mixture composed of 30 parts of styrene, 35 parts of butyl acrylate, 35 parts of acrylic acid and 3 parts of azobisisolutyronitrile was added dropwise over 3 hours to 90 parts of Cellosolve in a reactor maintained at 120° C. in an atmosphere of nitrogen gas. After the addition, the mixture was aged for 1 hour, and a mixture of 1 part of azobisdimethylvaleronitrile and 10 parts of Cellosolve was added dropwise over 1 hour, and the mixture was further aged for 5 hours to give a solution of an acrylic resin having a high acid value (260). Then, 58 parts of a compound of the following formula

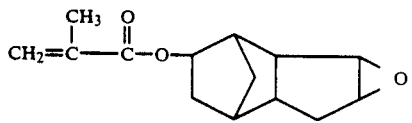

and 0.3 part of hydroquinone monomethyl ether were added to the solution, and while air was blown into the mixture, it was reacted at 90° C. for 5 hours to give a solution of an unsaturated resin (acid value about 80; number of unsaturated groups 1.53/1,000 of molecular weight; number average molecular weight about 15,000).

SYNTHESIS EXAMPLE 2 (UNSATURATED RESIN)

To 204 parts of the acrylic resin having a high acid value obtained in Synthesis Example 1 were added 58 parts of a compound of the following formula

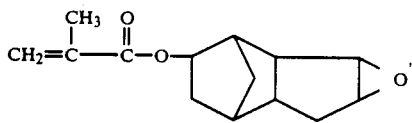

12 parts of a compound of the following formula

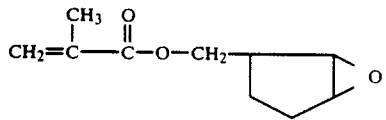

and 0.3 part of hydroquinone monomethyl ether. While air was blown into the mixture, it was reacted at 80° C. for 5 hours to form a solution of an unsaturated resin (acid value 52; number of unsaturated groups 1.82/1,000 of molecular weight; number average molecular weight about 16,000).

SYNTHESIS EXAMPLE 3 (UNSATURATED RESIN)

A mixture composed of 40 parts of methyl methacrylate, 35 parts of butyl acrylate, 25 parts of acrylic acid and 2 parts of azobisisobutyronetrile was added dropwise over 3 hours to 90 parts of propylene glycol monomethyl ether in a reactor maintained at 110° C. in an atmosphere of nitrogen gas. After tne addition, the mixture was aged for 1 hour, and a mixture composed of 1 part of azobisdimethylvaleronitrile and 10 parts of propylene glycol monomethyl ether was added dropwise over 1 hour. The mixture was aged for 5 hours to give a solution of an acrylic resin having a high acid value (184). Then, 36 parts of a compound of the following formula

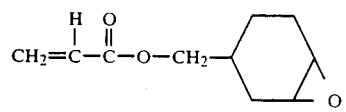

and 0.25 part of hydroquinone monomethyl ether were added. While air was blown into the mixture, it was reacted at 80° C. for 5 hours to give a solution of an unsaturated resin (acid value 58; number of unsaturated groups 1.42/1,000 of molecular weight; number average molecular weight about 20,000).

SYNTHESIS EXAMPLE 4 (UNSATURATED RESIN)

A mixture composed of 40 parts of methyl methacrylate, 25 parts of butyl acrylate, 15 parts of 2-hydroxyethyl methacrylate, 20 parts of acrylic acid and 2 parts of azobisisobutyronitrile was added dropwise over 3 hours to 90 parts of butyl Cellosolve in a reactor maintained at 105° C. in an atmosphere of nitrogen gas. After the addition, the mixture was aged for 1 hour, and a mixture of 1 part of azobisdimethylvaleronitrile and 10 parts of propylene glycol monomethyl ether was added dropwise over 1 hour. The mixture was aged for 5 hours to give a solution of an acrylic resin having a high acid value (150). Then, 25 parts of a compound of the following formula

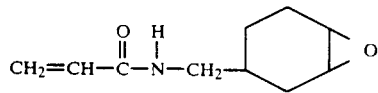

and 0.1 part of hydroquinone monomethyl ether were added to the solution. While air was blown into the mixture, it was reacted at 80° C. for 5 hours to give a solution of an unsaturated resin (acid value 60; number of unsaturated groups 1.1/1,000 of molecular weight; number average molecular weight 20,000).

SYNTHESIS COMPARATIVE EXAMPLE 1 (COMPARATIVE RESIN)

A mixture composed of 30 parts of styrene, 40 parts of butyl acrylate, 30 parts of acrylic acid and 3 parts of azobisisobutyronitrile was added dropwise over 3 hours to 90 parts of Cellosolve in a reactor maintained at 120° C. in an atmosphere of nitrogen gas. After the addition, the mixture was aged for 1 hour, and a mixture of 1 part of azobisdimethylvaleronitrile and 10 parts of Cellosolve was added dropwise over 1 hour. The mixture was aged for 5 hours to give a solution of an acrylic resin having a high acid value (222). Then, 32 parts of glycidyl methacrylate, 0.25 part of hydroquinone monomethyl ether and 0.6 part of tetraethyl ammonium bromide were added, and while blowing air into the mixture, it was reacted at 110° C. for 5 hours to give a solution of an unsaturated resin (acid value 76; number of unsaturated groups 1.67/1000 of molecular weight; number average molecular weight about 15,000).

EXAMPLE 1

Eight parts of alpha-hydroxyisobutylphenone was added to 262 parts of the solution finally obtained in Synthesis Example 1 (Unsaturated Resin), and 11.5 parts of triethylamine the degree of neutralization 0.5) was added to neutralize the unsaturated resin. While the resulting solution was being stirred at high speeds by using a Disper, 1,410 parts of deionized water was gradually added to give an aqueous dispersion having a solids content of 10 %. The aqueous dispersion was spray-coated on an aluminum plate, dried at 80° C. for 15 minutes, and irradiated with UV for 5 seconds from a high-pressure mercury lamp (120 W/cm) to cure the film. The thickness of the coated film was about 20 micrometers. The adhesion and water resistance of the coated film were examined.

EXAMPLE 2

Eight parts of alpha-hydroxyisobutylphenone was added to 274 parts of the solution finally obtained in Synthesis Example 2 (Unsaturated Resin), and 8 parts of triethyalmine (degree of neutralization 0.5) was added to neutralize the resin. By operating in the same way as in Example 1, an aqueous dispersion having a solids concentration of 10 % was prepared. The safe test as in Example 1 was conducted.

COMPARATIVE EXAMPLE 1

Seven parts of alpha-hydroxyisobutylphenone was added to 236 parts of the solution finally obtained in Synthesis Comparative Example 1 (Comparative Resin), and 9 parts of triethylamine (neutralization degree 0.5) was added to neutralize the resin. By operating in the same way as in Example 1, an aqueous dispersion having a solids concentration of 10 % was prepared. The same test as in Example 1 was conducted.

EXAMPLE 3

Titanium white (24 parts) was added to 262 parts of the solution finally obtained in Synthesis Example 1 (Unsaturated Resin and the pigment was dispersed by a shaker. Then, 11.5 parts by weight of triethylamine was added to neutralize the resin. While the solution was stirred by a Disper, 447parts of deionized water was added to give an aqueous dispersion having a solids concentration of 25 % by weight.

The aqueous dispersion was coated on an aluminum plate by a bar coater, dried at 80° C. for 15 minutes, and then irradiated with electron beams in a dose of 5 Megarads to cure the coated film. The thickness of the coated film was about 20 micrometers. Its adhesion and water resistance were examined.

COMPARATIVE EXAMPLE 2

Twenty parts of titanium white was dispersed in 236 parts of the solution obtained finally in Synthesis Comparative Example 1 (Comparative Resin) by means of a shaker. Then, 9 parts by weight of triethylamine was added to neutralize the resin. Then, by operating as in Example 3, an aqueous dispersion having a solids concentration of 25 % was prepared, and tesred as in Example 3.

The results of testing the coated films in Examples 1 to 3 and Comparative Examples 1 and 2 are summarized in Table 1.

TABLE 1

| Test item | Example 1 | Example 2 | Example 3 | Comparative Example 1 | Comparative Example 2 |
|---|---|---|---|---|---|
| Storage stability (3) | Good after 6 months | Good after 6 months | Good after 4 months | Separated after 6 months | Separated after 3 months |
| Curing of the coated film | Good | Good | Good | Good | Good |
| Initial adhesion (1) | 100/100 | 100/100 | 100/100 | 80/100 | 70/100 |
| Adhesion after immersion in water (2) | 100/100 | 100/100 | 100/100 | 30/100 | 0/100 |

The tests were performed by the following methods.

(1) Initial adhesion

In accordance with the Testing Method of JIS D-0-202, crosscuts were provided in a test piece at intervals of 1 mm to form 100 squares. A cellophane adhesive tape was applied to the test piece and peeled off. The number of squares which were peeled off was counted and made the numerator, and the number of the original squares (100) was given as the denominator.

(2) Adhesion after immersion in water

The coated plate was immersed for one day in hot water at 50° C. The water on the surface was wiped off, and after standing at room temperature for 1 hour, the coated plate was subjected to the same test as in 1) above.

(3) Storage stability

Seven hundred cubic centimerers of the aqueous dispersion was put in a 1-liter brown polyethylene bottle, and stored at 40° C., and the state of the aqueous dispersion was examined every half month.

EXAMPLE 4

Three parts of 2-methyl-1-[4-(methylthio)-phenyl]-2-morpholino-propene was added to 239 parts of the solution finally obtained in Synthesis Example 3 (Unsaturated Resin), and then 9 parts of triethylamine (neutralization degree about 0.6) was added to neutralize the resin. While the resulting solution was stirred at high speeds by using a Disper, 1,170 parts of deionized water was gradually added to give an aqueous dispersion having a solids concentration of 10 %.

This aqueous dispersion was used as an anionic electrodeposition coating bath, and a copper-clad laminated plate as an anode and a stainless steel plate as a cathode were put in the bath. A constant current of 60 mA/dm was passed for 3 minutes between the two electrodes to deposit an electrodeposition film in the copper clad laminated plate. The copper-clad plate was then pulled up from the bath, washed with water, and dried at 70° C. for 5 minutes to firm a coated film having a thickness of 20 micrometers. A negative film for a printed circuit was hermetically brought into intimate contact with the coated film, and light was irradiated from a 3 KW ultra-high-pressure mercury lamp (3000 mJ/cm², 365 nm), and then the uncured portion of the coated plate was removed by using a 1 % aqueous solution of sodium carbonate. Then, a solution of ferric chloride at 50° C. was sprayed onto the plate to remove the exposed copper portion by etching. The cured portion of the coating was then removed by a 3 % aqueous solution of sodium hydroxide to give a printed circuit board with sharp image lines.

EXAMPLE 5

Carbon black (25 parts) and 5 parts of methylene blue were added to 228 parts of the solution finally obtained in Synthesis Example 4 (Unsaturated Resin) and dispersed by a three-roll fill, and then 12 parts of trimethylolpropane triacrylate and 7 parts of 2,2-dimethoxy-2-phenylacetophenone were added. Furthermore, 6 parts (degree of neutralization 0.5) was added to neutralize the resin. While the solution was stirred by a Disper, 3,000 parts of deionized water was gradually added to form an aqueous solution having a solids concentration of 30 %. Using this solution as an aqueous relief printing ink and Sonne KPM 2000 (a tradename for a photosensitive resin plate made by Kansai Paint Co., Ltd.), printing was carried out by a printing machine on high quality paper and then subjected to UV irradiation from an 80 W/cm water-cooled high-pressure mercury lamp. Printed matter having letters of clear contours was obtained.

SYNTHESIS EXAMPLE 5 (UNSATURATED RESIN)

A mixture composed of 30 parts of styrene, 35 parts of butyl acrylate, 35 parts of acrylic acid and 3 parts of azobisisobutyronitrile was added dropwise over 3 hours to 50 parts of n-butanol and 40 parts of methyl isobutyl ketone placed in a reactor maintained at 110° C. in an atmosphere of nitrogen gas. After the addition, the mixture was aged for 1 hour, and a mixture of 1 part of azobisdimethylvaleronitrile and 10 parts of methyl isobutyl ketone was added dropwise over 1 hour. The mixture was aged for 5 hours to give a solution of an acrylic resin having a high acid value (260). To the solution were added 98 parts of a compound of the following formula

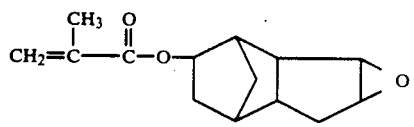

and 0.14 part of hydroquinone monomethyl ether. While air was blown into the mixture, it was reacted at 80° C. for 5 hours to give a solution of an unsaturated resin (acid value about 20; number of unsaturated groups 1.98/1,000 of molecular weight; number average molecular weight about 17,000).

SYNTHESIS EXAMPLE 6 (UNSATURATED RESIN)

To 204 parts by weight of the solution of the acrylic resin obtained in Synthesis Example 5 were added 98 parts of a compound of the following formula

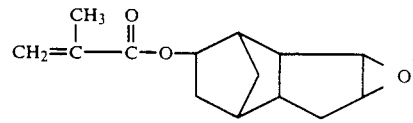

10 parts of a compound of the following formula and 0.15 part of hydroquinone. While air was blown into the mixture, it was reacted at 80° C. for 5 hours to give a solution of an unsaturated resin (acid value 1; number of unsaturated groups 2 25/1,000 of molecular weight; number average molecular weight about 18,000).

SYNTHESIS EXAMPLE 7 (UNSATURATED RESIN)

A mixture composed of 40 parts of methyl methacrylate, 35 parts of butyl acrylate, 25 parts of acrylic acid and 1 part of azobisisobutyronitrile was added dropwise over 3 hours to 90 parts of n-butanol in a reactor maintained at 110° C. in an atmosphere of nitrogen gas. After the addition, the mixture was aged for 1 hour, and a mixture of 1 part of azooisdimethylvaleronitrile and 10 parts of methyl isobutyl ketone was added dropwise over 1 hour. The mixture was aged for 5 hours to give a solution of an acrylic resin having a high acid value (184). Then, 62 parts of a compound of the following formula

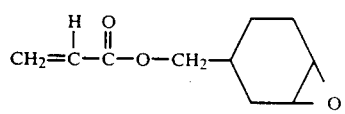

0.12 part of hydroquinone were added to the solution. While air was blown into the mixture, it was reacted at 80° C. for 5 hours to give a solution of an unsaturated resin (acid value 0; number of unsaturated groups 2.07/1,000 of molecular weight; number average molecular weight about 30,000).

SYNTHESIS EXAMPLE 8 (UNSATURATED RESIN)

A mixture composed of 20 parts of methyl methacrylate, 20 parts of styrene, 25 parts of methyl acrylate, 15 parts of 2-hydroxyethyl methacrylate, 20 parts of acrylic acid and 5 parts of azobisisobutyronitrile was added dropwise over 3 hours to 60 parts of butyl Cellosolve in a reactor maintained at 105° C. in an atmosphere of nitrogen gas. After the addition, the mixture was aged for 1 hour, and a mixture of 1 part of azobisdimethylvaleronitrile and 7 parts of butyl Cellosolve was added dropwise over 1 hour. The mixture was aged for 5 hours to give a solution of an acrylic resin having a high acid value (150). To the solution were added 25 parts of a compound of the following formula

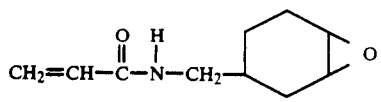

and 0.06 part of hydroquinone. While air was blown into the mixture, it was reacted at 80° C. for 5 hours to give a solution of an unsaturated resin (acid value 60; number of unsaturated groups 1.1/1,000 of molecular weight; number average molecular weight 110,000).

SYNTHESIS EXAMPLE 9 (UNSATURATED RESIN)

A mixture composed of 25 parts of styrene, 23 parts of butyl acrylate, 52 parts of a compound of the following formula

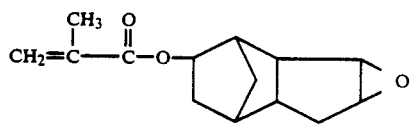

and 3 parts of t-butyl peroxy-2-ethylhexanoate was added dropwise over 3 hours to 20 parts of n-butanol and 70 parts of ethyl isobutyl ketone in a reactor maintained at 110° C. in an atmosphere of nitrogen gas. After the addition, the mixture was aged for 1 hour, and a mixture of 1 part of t-butyl peroxy-2-ethylhexanoate and 10 parts of methyl isobutyl ketone was added dropwise over 1 hour. The mixture was aged for 7 hours to give a solution of an alicyclic epoxy group-containing acrylic resin. To the solution were added 16 parts of acrylic acid and 0.12 part of hydroquinone, and while air was blown into the mixture, it was reacted at 80° C. for 7 hours to give a solution of an unsaturated resin (number of unsaturated groups 1.85/1000 of molecular weight; number average molecular weight about 18,000).

SYNTHESIS EXAMPLE 10 (UNSATURATED RESIN)

A mixture composed of 40 parts of butyl methacrylate, 24 parts of butyl acrylate, 36 parts of a compound of the following formula

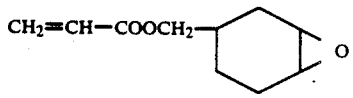

and 2 parts of t-butyl peroxy-2-ethylhexanoate was added dropwise over 3 hours to 90 parts of isobutyl acetate in a reactor maintained at 110° C. in an atmosphere of nitrogen. After the addition, the mixture was aged for 1 hour, and a mixture of 1 part of t-butyl peroxy-2-ethylhexanoate and 10 parts of isobutyl acetate was added dropwise over 1 hour. The mixture was aged for 7 hours to give an alicyclic epoxy group-containing acrylic resin solution.

To the solution were added 14 parts of acrylic acid and 0.12 part of hydroquinone. While air was blown into the mixture, it was reacted at 80° C. for 5 hours to give a solution of an unsaturated resin (number of unsaturated groups 1.66/1000 of molecular weight; number average molecular weight 25,000).

SYNTHESIS COMPARATIVE EXAMPLE 2 (COMPARATIVE RESIN)

A mixture composed of 30 parts of styrene, 40 parts of butyl acrylate, 30 parts of acrylic acid and 3 parts of azobisisobutylonitrile was added dropwise over 3 hours to 50 parts of n-butanol and 40 parts of methyl isobutyl ketone in a reactor maintained at 120° C. in an atmosphere of nitrogen gas. After the addition, the mixture was aged for 1 hour, and a mixture of 1 part of azobis-dimethylvaleronitrile and 10 parts of Cellosolve was added dropwise over 1 hour. The mixture was aged for 5 hours to give a solution of an acrylic resin having a high acid value (222). To the solution were added 56 parts of glycidyl methacrylate, 0.12 part of hydroquinone and 0.6 part of tetraethyl ammonium bromide. While air was blown into the mixture, it was reacted at 120° C. for 8 hours to give a solution of an unsaturated resin (acid value 5; number of unsaturated groups 2.5/1,000 of molecular weight; number average molecular weight about 15,000).

EXAMPLE 6

Ten parts of alpha-hydroxyisobutylphenone was added to 300 parts of the solution of the unsaturated resin finally obtained in Synthesis Example 5. The resulting solution was coated on an aluminum plate by a bar coater, dried at 80° C. for 15 minutes, and irradiated with UV for 5 seconds from a 120 W/cm high-pressure mercury lamp to cure the coated film. The thickness of the coated film was about 20 micrometers. The adhesion and water resistance of the coated film were examined.

EXAMPLE 7

One hundred parts of Aronix M5700 (a tradename for a vinyl monomer, produced by Toagosei Chemical Industry Co., Ltd ) and 20 parts of tripropylene glycol diacrylate were added to 300 parts of the solution of the unsaturated resin finally obtained in Synthesis Example 5, and the mixture was heated to 100° C. While air was blown into the mixture, the pressure was reduced to remove n-butanol and methyl isobutyl ketone from the solution. Furthermore, 16 parts of alpha-hydroxyisobutylphenone was added. The resulting composition was coated on an aluminum plate by a bar coater and irradiated for 5 seconds with UV from a 120 W/cm high-pressure mercury lamp to cure the coated film. The thickness of the coated film was 20 micrometers. The adhesion and water resistance of the coated film were examined.

EXAMPLE 8

Aronix M5700 (vinyl monomer; 106 parts) and 22 parts of tripropyiene glycol diacrylate were added to 312 parts of the solution of the unsaturated resin obtained finally in Synthesis Example 6. The solvents were removed as in Example 7, and 17 parts of alpha-hydroxy-isobutylphenone was added. The resulting composition was coated and cured as in Example 7.

EXAMPLE 9

Six parts of alpha-hydroxyisobutylphenone was added to 220 parts of the solution or the unsaturated resin obtained finally in Synthesis Example 9. The resulting solution was coated on an aluminum plate by a bar coater, dried at 80° C. for 15 minutes, and irradiated with UV for 2 seconds from a 120 W/cm high-pressure mercury lamp to cure the coated film. The thickness of the coated film was about 20 micrometers. The adhesion and water resistance of the coated film were examined.

EXAMPLE 10

Sixty parts of Aronix M5700 (vinyl monomer) and 12 parts of tripropylene glycol diacrylate were added to 220 parts of the solution of the unsaturated resin obtained in Synthesis Example 9. The mixture was heated to 100° C. While air was blown into the mixture, the pressure was reduced to remove n-butanol and methyl isobutyl ketone in the solution. Furthermore, 10 parts of alpha-hydroxyisobutylphenone was added. The resulting composition was coated on an aluminum plate by means of a bar coater, and irradiated for 2 seconds with UV from a 12 W/cm high-pressure mercury lamp to cure the coated film. The thickness of the coated film was 20 micrometers. The adhesion and water resistance of the coated film were examined.

COMPARATIVE EXAMPLE 3

Eight parts of alpha-hydroxyisobutylphenone was added to 260 parts of the solution of the comparative resin obtained finally in Synthesis Comparative Example 2. The mixture was tested as in Example 6.

COMPARATIVE EXAMPLE 4

Eighty parts of Aronix M5700 and 16 parts of tripropylene glycol diacrylate were added to 260 parts of the solution of the comparative resin obtained finally in Synthesis Comparative Example 2. The solvent were removed as in Example 7, and then 13 parts by weight of alpha-hydroxyisobutylphenone was added. The resulting resin was cured as in Example 7.

The results of the film tests in Examples 6 to 10 and Comparative Examples 3 and 4 are summarized in Table 2.

TABLE 2

| Test item | Example | | | | | Comparative Example | |
|---|---|---|---|---|---|---|---|
| | 6 | 7 | 8 | 9 | 10 | 3 | 4 |
| Curing of the coated film | Good | Good | Good | Good | Good | Good | Good |
| Initial adhesion[1] | 100/100 | 100/100 | 100/100 | 100/100 | 100/100 | 70/100 | 80/100 |
| Adhesion after immersion in water[2] | 100/100 | 100/100 | 100/100 | 100/100 | 100/100 | 20/100 | 50/100 |

[1,2]The adhesion properties were tested as in Table 1.

EXAMPLE 11

Fifty parts of tripropylene glycol diacrylate, 50 parts of 1,6-hexanediol diacrylate, and 150 parts of trimethylolpropane triacrylate were added to 264 parts of the solution of the unsaturated resin obtained finally in Synthesis Example 7. The mixture was heated to 100° C., and while air was blown into the mixrure, n-butanol in the solution was removed. Titanium white (62 parts) was further added and dispersed in a ball mill to prepare a white paint. The paint was coated of a gypsum board having a thickness of 1.5 cm by means of a curtain coater, and irradiated with electron beams at a dose of 7 Megarads to cure the coated film and produce a gypsum tile. The thickness of the coated film was about 100 micrometers, and it had good adhesion to gypsum. The gypsum tile was applied to a wall and its appearance and adhesion were evaluated for three months. After three months, it had as good appearance and adhesion as in the initial stage.

EXAMPLE 12

The solution of the unsaturated resin finally obtained in Synthesis Example 8 (198 parts), 20 parts of a phenol novolak epoxy resin (epoxy equivalent 173), 5 parts of alpha-hydroxyisobutylphenone and 0.5 part of Phthanocyanine Green were kneaded by a three-roll mill. The resulting composition was used as a solder resist ink for a printed circuit board. Then, the ink was coated on a copper through-hole printed circuit board by a screen printing method and dried at 70° C. for 10 minutes (film thickness 15–20 micrometers). A film having a required pattern was brought into intimate contact with the coated film, and light from a 3 KW ultrahigh-pressure mercury lamp was irradiated onto it in a quantity of 800 mJ/cm$^2$. The unexposed portion was removed by using a 1 % aqueous solution of sodium carbonate, and the printed circuit board was heated at 140° C. for 30 minutes to form a solder resist film. This solder resist film had excellent heat resistance, for example, solder plating resistance, and excellent chemical resistance to acids and alkalies.

EXAMPLE 13

Forty parts of tripropylene glycol diacrylate, 40 parts of 1,6-hexanediol diacrylate and 30 parts of trimethylolpropane triacrylate were added to 217 parts of the solution of the unsaturated resin finally obtained in Synthesis Example 10. The mixture was heated to 100° C. While air was blown into the mixture, the pressure was reduced to remove isobutyl acetate from the solution. Titanium white (55 parts) was added and dispersed by a ball mill to prepare a white paint. As in Example 9, this paint was coated on a gypsum board and irradiated with electron beams to form a white gypsum tile. The gypsum tile was applied to a wall, and its appearance and adhesion were evaluated for 3 months. After three months, it had as good appearance and adhesion as in the initial stage.

We claim:

1. An unsaturated resin composition curable with an active energy ray, comprising a reaction product between an acid group-containing vinylic resin and an alicyclic epoxy group-containing unsaturated compound.

2. The resin composition of claim 1 in which the reaction product is water-dispersed or water-solubilized.

3. The resin composition of claim 1 in which the reaction product is in the form of a solution in an organic solvent or in a polymerizable vinyl monomer.

4. The resin composition of claim 1 in which the acid group-containing vinylic resin is a copolymer of an ethylenically unsaturated acid and at least one other vinylic monomer.

5. The resin composition of claim 1 in which the acid group-containing vinylic resin has an acid value of at least 15.

6. The resin composition of claim 1 in which the alicyclic epoxy group-containing unsaturated compound is selected from the group consisting of

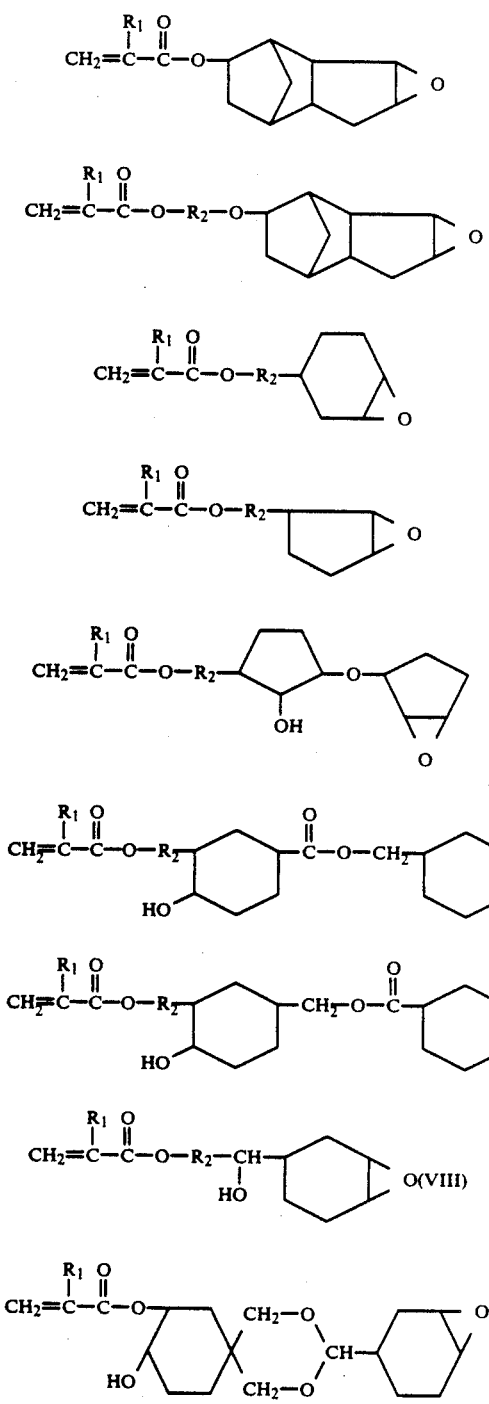

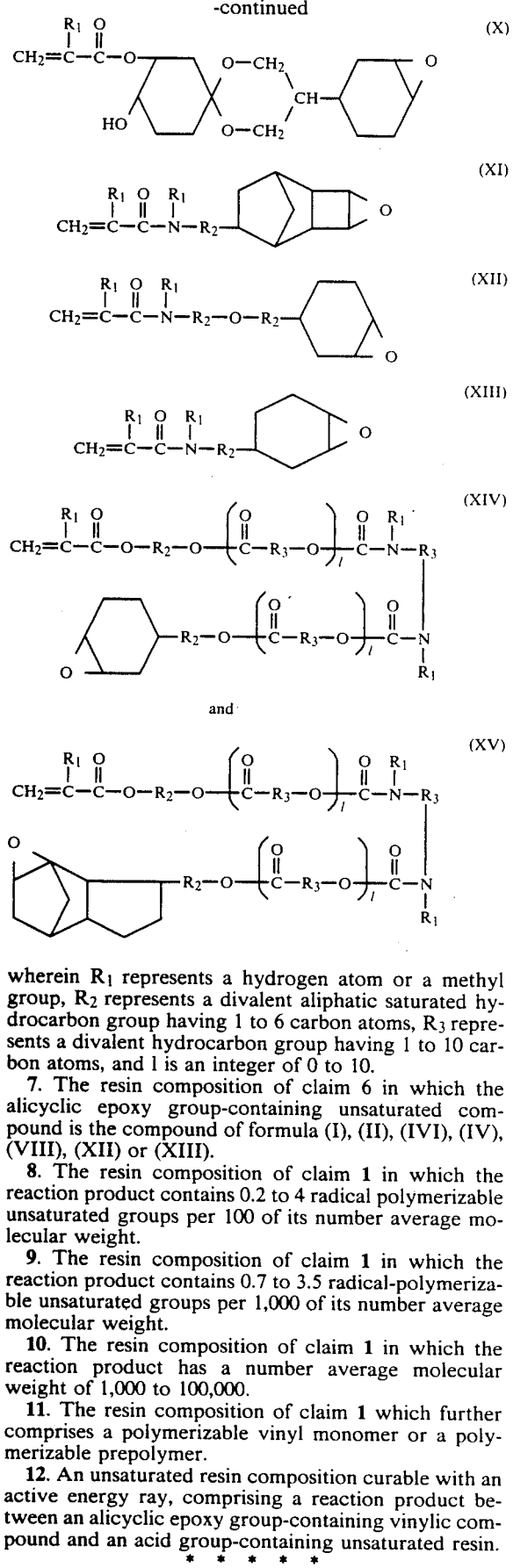

wherein $R_1$ represents a hydrogen atom or a methyl group, $R_2$ represents a divalent aliphatic saturated hydrocarbon group having 1 to 6 carbon atoms, $R_3$ represents a divalent hydrocarbon group having 1 to 10 carbon atoms, and $l$ is an integer of 0 to 10.

7. The resin composition of claim 6 in which the alicyclic epoxy group-containing unsaturated compound is the compound of formula (I), (II), (IVI), (IV), (VIII), (XII) or (XIII).

8. The resin composition of claim 1 in which the reaction product contains 0.2 to 4 radical polymerizable unsaturated groups per 100 of its number average molecular weight.

9. The resin composition of claim 1 in which the reaction product contains 0.7 to 3.5 radical-polymerizable unsaturated groups per 1,000 of its number average molecular weight.

10. The resin composition of claim 1 in which the reaction product has a number average molecular weight of 1,000 to 100,000.

11. The resin composition of claim 1 which further comprises a polymerizable vinyl monomer or a polymerizable prepolymer.

12. An unsaturated resin composition curable with an active energy ray, comprising a reaction product between an alicyclic epoxy group-containing vinylic compound and an acid group-containing unsaturated resin.

* * * * *